(12) United States Patent
Sato

(10) Patent No.: US 7,688,559 B2
(45) Date of Patent: *Mar. 30, 2010

(54) ELECTROSTATIC DISCHARGE PROTECTIVE CIRCUIT AND SEMICONDUCTOR INTEGRATED CIRCUIT USING THE SAME

(75) Inventor: Koichi Sato, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/267,360

(22) Filed: Nov. 7, 2008

(65) Prior Publication Data

US 2009/0067107 A1     Mar. 12, 2009

Related U.S. Application Data

(60) Continuation of application No. 11/776,528, filed on Jul. 11, 2007, now Pat. No. 7,457,087, which is a division of application No. 11/094,091, filed on Mar. 29, 2005, now Pat. No. 7,256,976.

(30) Foreign Application Priority Data

May 25, 2004   (JP)   ............................ 2004-155051

(51) Int. Cl.
*H02H 9/00* (2006.01)
(52) U.S. Cl. ...................................................... 361/56
(58) Field of Classification Search .................... 361/56
See application file for complete search history.

(56) References Cited

U.S. PATENT DOCUMENTS 7,256,976 B2 *   8/2007   Sato ............................ 361/56
7,457,087 B2 *   11/2008  Sato ............................ 361/56

\* cited by examiner

*Primary Examiner*—Stephen W Jackson
(74) *Attorney, Agent, or Firm*—DLA Piper LLP (US)

(57) ABSTRACT

An electrostatic discharge protective circuit including an ESD protective circuit which has a trigger terminal and forms a discharge path from a first node to a second node when trigger signals are supplied to the trigger terminal, a trigger circuit included in a circuit to be protected which is connected between the first and second nodes, the trigger circuit having a first MOS device, and which functions as a part of the circuit to be protected at the time of normal operation when ESD voltage is not applied, and forms a conductive path between a drain and source of the MOS device when ESD voltage of a predetermined value or more is applied to the first node during a normal operation, and supplying the trigger signals to the trigger terminal of the ESD protective circuit when the first MOS device becomes conductive.

12 Claims, 3 Drawing Sheets

ELECTROSTATIC DISCHARGE PROTECTIVE CIRCUIT AND SEMICONDUCTOR INTEGRATED CIRCUIT USING THE SAME

CROSS-REFERENCE TO RELATED APPLICATIONS

This is a continuation of application Ser. No. 11/776,528, filed Jul. 11, 2007 now U.S. Pat. No. 7,457,087, which is a divisional of application Ser. No. 11/094,091, filed Mar. 29, 2005 now U.S. Pat. No. 7,256,976, and is also based upon and claims the benefit of priority from prior Japanese Patent Application No. 2004-155051, filed May 25, 2004, the entire contents of all of which are incorporated herein by reference.

BACKGROUND

1. Field of the Invention

The present invention relates to an electrostatic discharge protective circuit and a semiconductor integrated circuit device using the same.

2. Description of the Related Art

As an interface of a semiconductor integrated circuit device is made to function at higher speeds, there is increasing demand for higher speed input/output buffer circuits connected between an internal circuit and an input/output terminal of a semiconductor integrated circuit. Normally, a logic circuit section of the internal circuit is required to be operated particularly at high speeds, and as a result a thin film transistor in which a thin gate insulation film is used is provided as a component thereof. Meanwhile, the input/output buffer circuit is formed of a thick film transistor in which the gate insulation film is formed to be thick, but in order to operate the input/output buffer circuit at high speeds, in some cases, the input/output buffer circuits also need to be formed of thin film transistors.

For example, as shown in FIG. 7, an output buffer circuit 76 which is formed of a pair of thin film PMOS device 71 and NMOS device 72 is connected between power source terminals 74 and 75 to which voltages VDD and VSS are applied, respectively. These terminals 74 and 75 will be referred to as VDD terminal and VSS terminal, hereinafter. An output of the output buffer circuit 76 is supplied to an I/O terminal 73. An ESD (electrostatic discharge) protective circuit 79 which comprises the PMOS device 77 and the NMOS device 78 is provided in parallel with the output buffer circuit 76. In this case, the gate of the NMOS device 78 which forms the protective circuit 79 is connected to the power source terminal 75 such that the NMOS device 78 is normally set to be off and is not turned on due to an output signal applied to the I/O terminal 73.

In this state, when the ESD voltage is applied to the I/O terminal 73, and if the gate of the thin transistors 71 and 72 of the output buffer circuit 76 is in a floating state, the output buffer circuit 76 will be turned on first. As a result, a large ESD surge current flows from the NMOS device 72 of the output buffer circuit 76 to the VSS terminal 75, and the NMOS device 72 may be damaged before it is protected by the ESD protective circuit 79.

In addition, the size of the ESD protective circuit 79 must be increased in order to increase the current capacity of the discharge path, but in general, the parasitic capacitance is large for a large MOS device, and this is inconsistent with increasing the operation speed. For this reason, as shown in FIG. 8, instead of using MOS devices in the ESD protective circuit 79, a protective device 81 such as an SCR (Semiconductor Controlled Rectifier) which has low parasitic capacitance and high discharge capacity is used in the ESD protective circuit together with diodes 82 and 83. In the circuit of FIG. 8, the VDD terminal 74 and the I/O terminal 73 are isolated by the diode 82 and the I/O terminal 73 and the VSS terminal 75 are isolated by the diode 83.

In the case where the protective device 81 comprising the SCR is used as the ESD protective circuit, the trigger voltage of the SCR must be set so as to be lower than the trigger voltage or the turning on voltage of the NMOS device 72 of the buffer circuit 76. However, since the electric potential at the gate of the buffer circuit and the internal circuit shown in FIGS. 7 and 8 at the time when the ESD voltage is applied is not generally fixed and is almost in a floating state, so that it is difficult to predict the sufficient trigger voltage. For example, it is impossible to accurately set the trigger voltage for the MOS device 72 at all cases. As a result, it is also difficult to set the trigger voltage at the protective device 81.

An example of a prior art using such an ESD protective circuit comprising SCR is that described Jpn. Pat. Appln. KOKAI Publication No. 8-293583. In the technology described in this publication, SCR is used for protecting an input/output buffer, but the configuration is complex because an SCR trigger dedicated circuit for triggering the SCR is formed separately from the input/output buffer. In addition, when ESD voltage is applied, a buffer circuit that is to be protected before the SCR trigger dedicate circuit operates, operates first and thus there is the possibility that a large current caused by the ESD flows to the buffer circuit which is damage.

BRIEF SUMMARY OF THE INVENTION

According to an aspect of the present invention, there is provided an electrostatic discharge protective circuit comprising: a first node; a second node which is electrically isolated from the first node; an ESD protective circuit which has a trigger terminal and forms a discharge path from the first node to the second node when trigger signals are supplied to the trigger terminal; and a trigger circuit included in a circuit to be protected which is connected between the first and second nodes, the trigger circuit having a first MOS device in which one of the source and the drain is connected to the first node, and which functions as a part of the circuit to be protected at the time of normal operation when ESD voltage is not applied, and forms a conductive path between the drain and source when ESD voltage or a predetermined voltage which is larger than a normal value applied to the first node during a normal operation is applied, and supplying the trigger signals to the trigger terminal of the ESD protective circuit when the first MOS device is turned on.

DETAILED DESCRIPTION OF THE INVENTION

Embodiments of the invention will be described in detail with reference to the drawings.

FIRST EMBODIMENT

Figure 1:
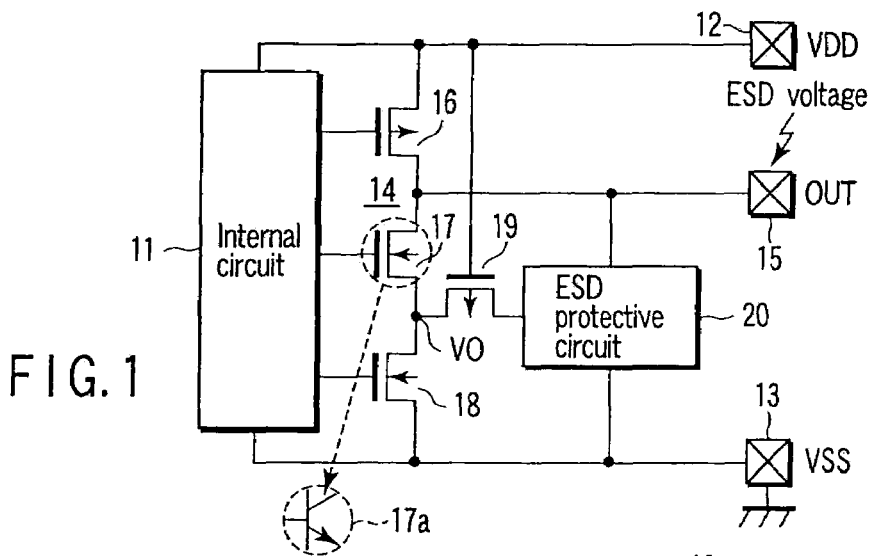
FIG. 1 is a block diagram showing a circuit configuration of an embodiment of the invention.

FIG. 1 is a block diagram for schematically showing an entire configuration of a first embodiment in which the invention is applied in a data output section of a semiconductor integrated circuit device. In FIG. 1, an internal circuit 11 of the semiconductor integrated circuit device is connected to a VDD terminal 12 and a VSS terminal 13 and energized. A data output from the internal circuit 11 is output to a data output terminal 15 via an output buffer circuit 14.

The output buffer circuit 14 comprises a PMOS device 16 whose source is connected to the VDD terminal 12 and an NMOS device 17 whose drain is connected to a drain of the PMOS device 16, and respective gates are connected to the data output section of the internal circuit 11. A source of the NMOS device 17 is connected to the VSS terminal 13 via an NMOS device 18, and also to a trigger terminal of an ESD protective circuit 20 via a PMOS device 19 which functions as a trigger circuit. A gate of the PMOS device 19 is connected to the VDD terminal 12. A discharge path for an ESD surge current provided in the ESD protective circuit 20 is connected between the output terminal 15 and the VSS terminal 13.

In the circuit of FIG. 1, in the normal operating state in which the ESD voltage is not applied to the data output terminal 15, the power source voltage VDD is applied from the VDD terminal 12 to the gate of the PMOS device 19. In this state, the PMOS device 19 is kept off, and the ESD protective circuit 20 is kept in a non-operative state.

Assume that in this state, positive ESD voltage of several thousands with respect to a grounding terminal 13, for example, is applied to the data output terminal 15. This ESD voltage is applied to a surge input terminal of the ESD protective circuit 20, and also applied to the drain of the PMOS device 16 and the drain of the NMOS device 17 from an output node of the output buffer circuit 14.

The NMOS device 17 herein has a configuration in which N-type diffusion regions acting as the source and drain are formed inside a P-type well, so that a parasitic NPN bipolar transistor 17a is formed inside the NMOS device 17. Thus, when a positive ESD voltage is applied to the drain of the NMOS device 17, a large voltage in the reverse direction is applied to an NP junction formed between the N-type drain and the P-type well. As a result, an avalanche breakdown current is generated due to the avalanche effect at the NP junction in the parasitic NPN bipolar transistor 17a. This phenomenon is referred to as a snapback action hereinafter.

Meanwhile, because a PN junction is formed in the forward direction between the P-type well and the N-type source, the parasitic NPN bipolar transistor 17a formed in the NMOS device 17 conducts current due to the snapback action, and the initial current flows to a coupling node VO formed between the NMOS device 17 and the PMOS device 19 and, causing a sudden increase in the electric potential at the node VO. As a result, the relationship between the voltage Vgs between the gate and source of the PMOS device 19 and the threshold value Vth thereof is such that Vgs>Vth, so that the PMOS device 19 becomes conductive. When the PMOS device 19 configuring the trigger circuit becomes conductive, trigger current flows to the trigger terminal of the ESD protective circuit 20, and as a result, the ESD protective circuit 20 becomes conductive. Consequently, the current caused by the ESD surge voltage applied to the data output terminal 15 takes the discharge path of the ESD protective circuit 20 and is discharged, thereby preventing damage from being applied to the output buffer circuit 14.

In this manner, according to this embodiment, circuits to be protected by the ESD protective circuit include the internal circuit 11 and MOS devices 16 to 18 which are connected between the power source terminals 12 and 13, as well as the MOS device 19. During a period of time when the ESD voltage is not applied, the MOS devices 16 to 18 function as a part of the circuit to be protected along with the internal circuit 11. When the ESD voltage is applied, the MOS devices 17 and 19 mainly function as a trigger circuit for trigger signal generation.

SECOND EMBODIMENT

Figure 2:
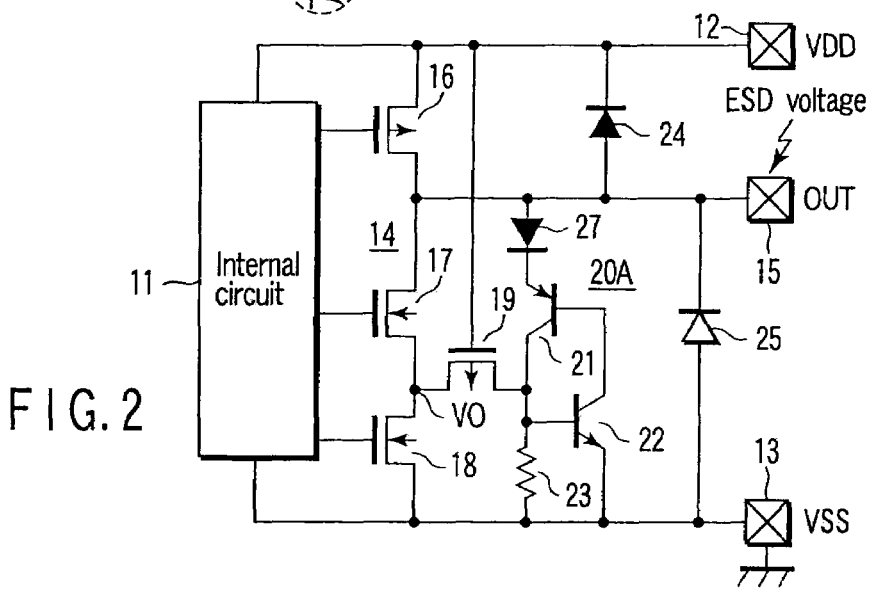
FIG. 2 is a circuit diagram showing a circuit configuration in the case where an SCR circuit is used as an ESD protective circuit of the embodiment in FIG. 1.

FIG. 2 is a block diagram showing a configuration of the second embodiment in which an SCR circuit is used as the ESD protective circuit 20 shown in FIG. 1, and the portions in FIG. 1 are assigned with the same or similar reference characters and descriptions thereof are omitted. In FIG. 2, an SCR circuit 20A comprises two bipolar transistors 21 and 22, and an emitter of the transistor 21 is connected via a diode 27 in the reverse direction to the data output terminal 15, and a collector of the transistor 21 is connected to the drain of the PMOS transistor 19 and also connected to the VSS terminal 13 via a resistor 23. The diode 27 may be of a multiple-diode type or may be omitted. A collector of the other transistor 22 is connected to a base of the transistor 21, a base of the transistor 22 is connected at a connection point of the PMOS transistor 19 and the resistor 23 of the trigger circuit, and an emitter of the transistor 22 is connected to the VSS terminal 13. It is to be noted that although it is not shown in FIG. 1, a diode 24 provided in the reverse direction with respect to the power source VDD is connected between the data output terminal 15 and the VDD terminal 12 as shown in FIG. 2. Further, a diode 25 in the reverse direction with respect to the ground potential VSS is connected between the data output terminal 15 and the VSS terminal 13.

In the circuit of FIG. 2, when ESD surge voltage is applied to the data output terminal 15, as is the case in FIG. 1, the NMOS device 17 in the buffer circuit 14 causes snapback action and the parasitic NPN bipolar transistor becomes conductive, and thereby the initial current flows into the coupling node VO. As a result, the electric potential at the node VO becomes at an extremely high level, the PMOS device 19 configuring the trigger circuit is turned on, and the current from the device 19 flows as the base current of the NPN bipolar transistor 22. Also, a potential at the base of the transistor 22 increases. Consequently, the voltage between the base and the emitter of the bipolar transistor 22 increases, the transistor 22 is turned on, and the base potential of the NPN bipolar transistor 21 is decreased to a level close to the ground potential VSS. As a result, the SCR circuit 20A is turned on due to conduction state of the transistor 21, and the ESD surge current applied to the terminal 15 is quickly discharged via the discharge path formed in the SCR circuit 20A.

In this manner, the NMOS device 17 which is a part of the data output buffer circuit 14 functioning as a part of the circuit to be protected is prevented from being damaged by the ESD surge voltage from the outside.

According to the configuration of FIG. 2, because the SCR circuit 20A is composed of the bipolar transistors, the SCR circuit 20A has low parasitic capacitance and does not hinder the high speed operation of the semiconductor integrated circuit. Also, the trigger operation of the SCR circuit 20A is controlled and set by the buffer circuit 14 itself and thus circuit design is much simpler.

MODIFIED EMBODIMENT

Figure 3:
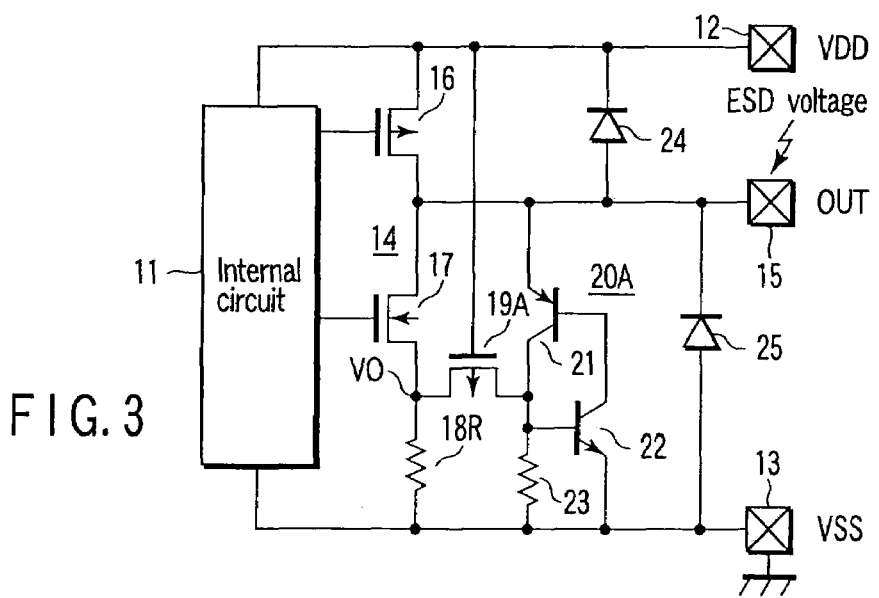
FIG. 3 is a circuit diagram showing a modified example of the embodiment shown in FIG. 2.

FIG. 3 shows a modified embodiment using a resistor 18R in place of the MOS device 18 in the second embodiment shown in FIG. 2. The other parts are the same as in FIG. 2 and are assigned the same reference characters and descriptions thereof are omitted. In the embodiments of FIGS. 1 and 2, in a normal operation state, the MOS device 18 is logically controlled so as to be usually off by gate signals applied from the internal circuit 11 to the gate, but in the modification of FIG. 3, this type of logical control operation is unnecessary. In the case of FIG. 3, after the potential of the node VO is increased due to the ESD surge voltage applied to the data output terminal 15, this potential is gradually reduced via the resistor device 18R. However, it is sufficient for the resistor value to be such that the potential VO of the node is maintained not lower than a predetermined value in the short period of time when the SCR circuit 20A becomes conductive due to the turning on of the PMOS device 19 because of the increase in the potential of the node VO. This potential increase is caused by the avalanche breakdown at the NPN structure in the NMOS device 17 in the similar manner as the case of FIGS. 1 and 2. The value of the resistor 18R must be set such that the performance of the buffer circuit 14 at the time of normal operation is not affected.

Also in the embodiments of FIGS. 2 and 3, as in the embodiment of FIG. 1, the MOS devices 16, 17 and 18 and the resistor 18R function as a part of the circuit to be protected when the ESD voltage is not applied, and function as a trigger circuit when the ESD voltage is applied.

In FIGS. 1, 2 and 3, the gate of the PMOS device 19 is connected to the VDD terminal 12. However, the configuration is not restricted to this, the gate of the PMOS device 19 may be connected to a VDD terminal other than the VDD terminal 12, for example. That is, the gate of the PMOS device 19 may be controlled high-level during the normal operation.

THIRD EMBODIMENT

Figure 4:
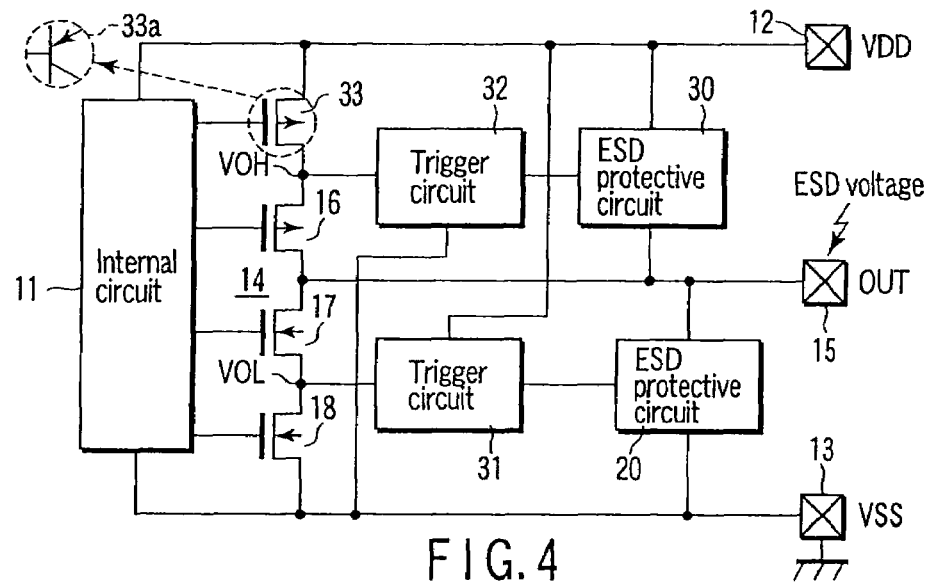
FIG. 4 is a block diagram showing a configuration of another embodiment of the invention.

FIG. 4 is a block diagram of yet another embodiment of the invention. In the embodiments and modified embodiments of FIGS. 1 to 3, the ESD protective circuit 20 or the SCR circuit 20A is inserted between the data output terminal 15 and the VSS terminal 13, and the ESD surge current is discharged to the VSS terminal 13 via the circuit 20 or 20A. In the embodiment of FIG. 4, the ESD protective circuit 20 is inserted between the data output terminal 15 and the VSS terminal 13, and also another ESD protective circuit 30 is inserted between the data output terminal 15 and the VDD terminal 12.

Thus, a trigger circuit 31 of the ESD protective circuit 20 is connected to a connection node VOL of the NMOS device 17 and the NMOS device 18 of the output buffer circuit 14, and also a trigger circuit 32 of the ESD protective circuit 30 is connected to a connection node VOH of the PMOS device 16 and a PMOS device 33 of the output buffer circuit 14. A source of the PMOS device 33 is connected to the VDD terminal 12. In this embodiment, the trigger circuit 31 is formed of, for example, a PMOS device, and a gate as a control device of the trigger circuit is connected to the VDD terminal 12 as is the case in the first embodiment of FIG. 1 so as to set to be off in a normal state. Similarly, the trigger circuit 32 is formed of a NMOS device and a gate as a control device of the trigger circuit is connected to the VSS terminal 13, and is normally set to be off.

As is the case in the embodiments of FIGS. 1 to 3, in FIG. 4, when the ESD voltage is not applied, the MOS devices 16, 17, 18 and 33 function as a part of the circuit to be protected including the internal circuit 11.

In the protective circuit of FIG. 4, the ESD surge voltage is applied to the data output terminal 15 with the VSS terminal 13 as the grounding. In the case where this ESD surge voltage is a positive high voltage, the surge current caused by the ESD surge voltage is discharged to the VSS terminal 13 via the ESD protective circuit 20 as is the case in the embodiment of FIG. 1.

Meanwhile, in the case where the ESD surge voltage is applied to the VDD terminal 12 with the output terminal 15 as the grounding, first, there is a forward direction PN junction between the P-type source and the N-type well of the PMOS device 33 in a parasitic PNP bipolar transistor 33a formed in the PMOS device 33. On the other hand, because NP junction between the N-type well and the P-type source is in the reverse direction, avalanche breakdown occurs at this portion, and in this PMOS device 33, snapback action occurs and the parasitic PNP bipolar transistor 33a becomes conductive. As a result, the PMOS device configuring the trigger circuit 32 is turned on and the ESD protective circuit 30 is triggered. Consequently, the ESD surge current is discharged from the VDD terminal 12 to the data output terminal 15.

FOURTH EMBODIMENT

Figure 5:
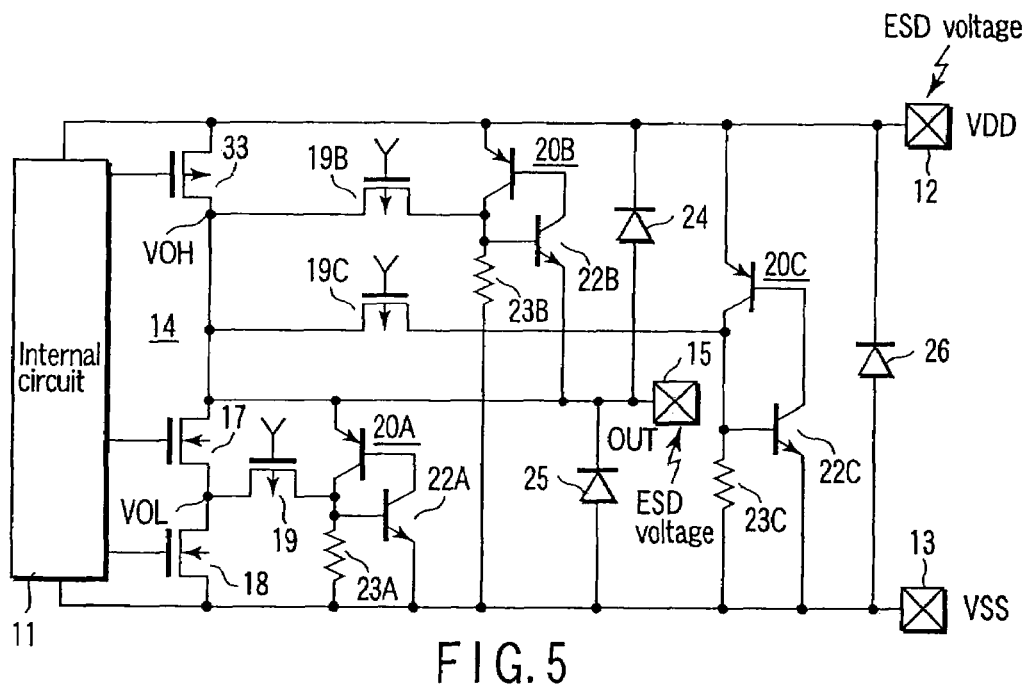
FIG. 5 is a block diagram showing a configuration of yet another embodiment of the invention.

FIG. 5 shows a circuit configuration of yet another embodiment of the invention. The configuration of this embodiment is one in which the embodiment shown in FIG. 4 is improved further, and an SCR circuit 20A having the same configuration as that of FIG. 3 is connected between the data output terminal 15 and the VSS terminal 13 as the ESD protective circuit 20 of FIG. 4. An SCR circuit 20B having the same configuration as the SCR circuit 20A is connected between the VDD terminal 12 and the data output terminal 15 as the ESD protective circuit 30 of FIG. 4. Also, an SCR circuit 20C is connected between the VDD terminal 12 and the VSS terminal 13 as a third ESD protective circuit. PMOS devices 19A, 19B and 19C which configure trigger circuits for supplying trigger signals to the SCR circuits 20A, 20B and 20C are connected between the bases of the PNP bipolar transistors 22A, 22B and 22C which are the trigger signal terminals for the node VOL and VOH respectively, and the gate voltage is controlled by the high level control signals from, for example, the internal circuit 11, such that it is on at the time of normal operation.

The operation of the embodiment of FIG. 5 will be described in the following. In the case where positive ESD surge voltage is supplied to the data output terminal 15 with the VSS terminal 13 as the grounding, snapback action occurs at the NMOS device 17 and the PMOS device 19 becomes conductive, so that trigger signals are supplied to the SCR circuit 20A and the ESD surge voltage of the terminal 15 is quickly discharged to the VSS terminal 13 via the circuit 20A.

In the case where the positive ESD surge voltage is supplied to the VDD terminal 12 with the output terminal 15 as the grounding, snapback action occurs at the PMOS device 33 and the PMOS device 19B becomes conductive, so that trigger signals are supplied to the SCR circuit 20B and the ESD surge voltage of the terminal 12 is quickly discharged to the output terminal 15 via the circuit 20B.

It is to be noted that in the case where a negative ESD voltage is supplied to the VDD terminal 12, an ESD discharge will be occurred from the VSS terminal 13 to the VDD terminal 12 via the diode 26.

In a case where a positive ESD voltage is applied to the terminal 12 with respect to the VSS terminal 13, the PMOS device 19C will become conductive in response to a high potential appearing at the node VOH due to the avalanche breakdown in the parasitic PNP transistor formed in the PMOS device 33, thereby discharging the ESD voltage via the circuit 20C.

In this manner, when the ESD voltage is not applied, the MOS devices 17, 18 and 33 function as a part of the circuit to be protected which includes the internal circuit 11, and function as a part of the circuit for supplying the trigger signals to the SCR circuits 20A to 20C when the ESD voltage is applied.

FIFTH EMBODIMENT

Figure 6:
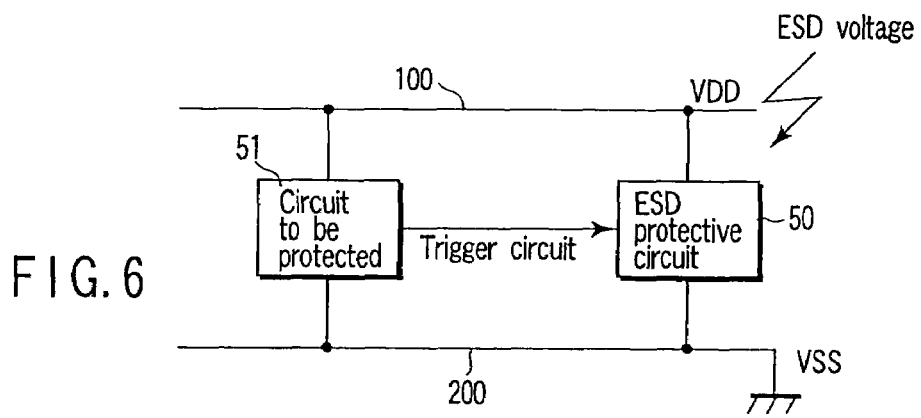
FIG. 6 is a block diagram showing a configuration of yet another embodiment of the invention.
Figure 7:
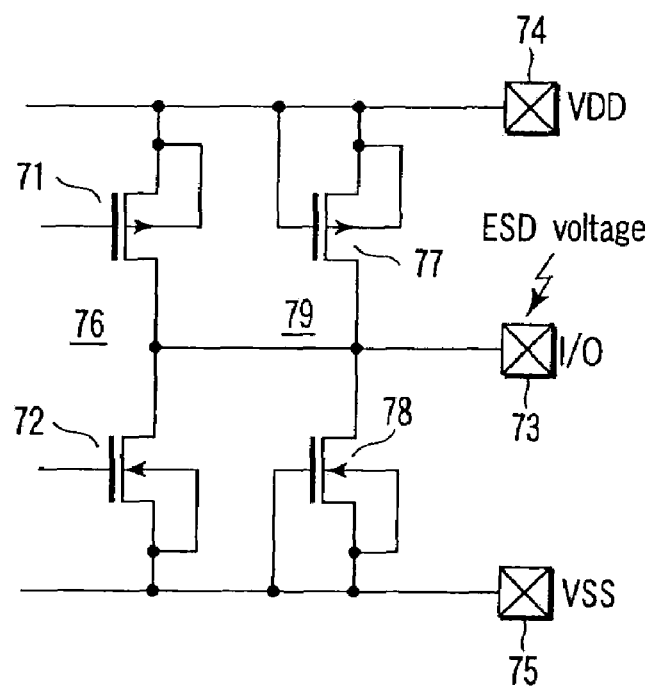
FIG. 7 is a circuit diagram showing a configuration of an example of a conventional electrostatic discharge protective circuit.
Figure 8:
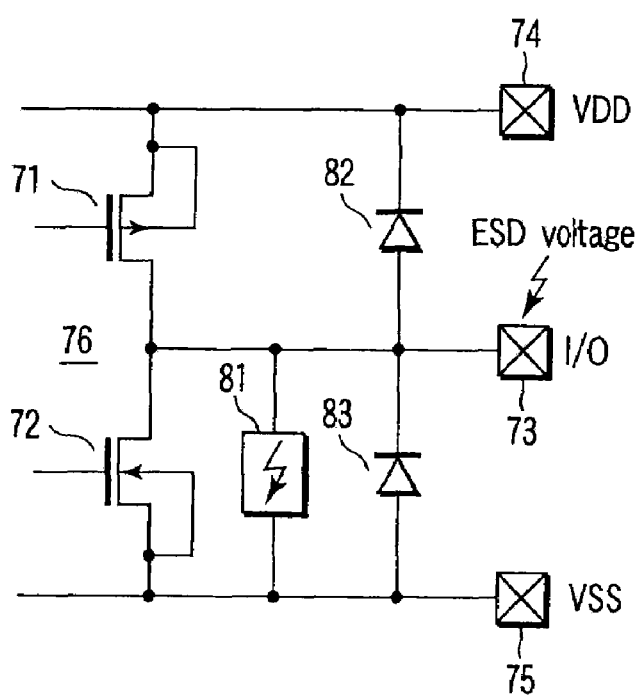
FIG. 8 is a circuit diagram showing a configuration of another example of the conventional electrostatic discharge protective circuit.

FIG. 6 is a block diagram of a configuration of yet another embodiment of the invention. An ESD protective circuit 50 shown in FIG. 6 may use the SCR circuit 20A used in the second embodiment shown in FIG. 2, for example.

In the embodiment of FIG. 6, the ESD protective circuit 50 and a circuit to be protected 51 are connected in parallel between a power source terminal 100 having a predetermined positive potential VDD and a grounding terminal 200 of a potential VSS. The internal structure of the circuit to be protected 51 is not shown, but at least a MOS circuit which functions as a part of the circuit to be protected 51 when ESD voltage is applied is formed therein. The configuration of the MOS circuit is such that when ESD voltage is applied to the power source terminal 100, the MOS circuit becomes conductive to make a current flow due to the ESD voltage. When this current flows, the current is supplied to the ESD protective circuit 50 as the trigger signal, the ESD protective circuit 50 becomes conductive, and the ESD voltage from the power source terminal 100 to the VSS terminal 200 can be quickly discharged and the circuit to be protected 51 is prevented from being damaged by the ESD voltage.

In this manner, when the ESD voltage is applied, the MOS circuit provided in the circuit to be protected 51 functions as a trigger signal generating circuit, and thus an electrostatic discharge protective circuit which has a simple circuit configuration and low parasitic capacitance as well as high ESD protective capability can be provided for effectively preventing the circuit to be protected 51 from being damaged by the ESD voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
    an internal circuit including an output buffer circuit to be protected from an ESD (electrostatic discharge) voltage;
    a first node connected to one end of the output buffer circuit;
    a second node connected to another end of the output buffer circuit;
    an ESD protective circuit which has a trigger terminal and forms a discharge path from the first node to the second node when a trigger signal is applied to the trigger terminal; and
    a trigger circuit including a first MOS device and a second MOS device, the first MOS device being connected in the output buffer circuit as a constituent thereof and also being coupled between the first and second nodes, the first MOS device having a source and a drain one of which is connected to the first node and forming a conductive path between the drain and the source thereof, the second MOS device having a source and a drain connected between the other of the source and the drain of the first MOS device and the trigger terminal of the ESD protective circuit and a gate connected to receive a power source voltage configured to set the second MOS device in a non-conductive state during a normal operation state and to set in a conductive state for supplying the trigger signals to the trigger terminal of the ESD protective circuit.

2. The semiconductor integrated circuit device according to claim 1, wherein the ESD protective circuit includes a bipolar transistor which becomes conductive due to the trigger signal of the trigger circuit and forms the discharge path, thereby discharging the ESD voltage.

3. The semiconductor integrated circuit device according to claim 1, wherein the trigger circuit is generally set to off in the normal operation state, and the second MOS device supplies the trigger signals to the trigger terminal of the ESD protective circuit due to an increase in the potential of one of the source and the drain of the first MOS device at the time when the ESD voltage is applied to the first node.

4. The semiconductor integrated circuit device according to claim 2, wherein the trigger circuit is generally set to off in the normal operation state, and the second MOS device supplies the trigger signal to the trigger terminal of the ESD protective circuit due to an increase in the potential of one of the source and the drain of the first MOS device at the time when the ESD voltage is applied to the first node.

5. The semiconductor integrated circuit according to claim 3, further comprising a third MOS device which is connected between the other of the source and the drain of the first MOS device and the second node and is logically controlled.

6. The semiconductor integrated circuit device according to claim 3, further comprising a resistor which is connected between the other of the source and the drain of the first MOS device and the second node.

7. A semiconductor integrated circuit device comprising:
    an internal circuit to be protected from an ESD voltage connected between a first power source terminal and a second power source terminal across which a predetermined power source voltage is applied;
    an output buffer circuit connected across an output terminal and one of the first and the second output terminals, the output buffer circuit including a first MOS device having a drain and a source forming a current path logically controlled by the internal circuit and one of the drain and source is connected to the output terminal;
    an ESD protective circuit having a discharge path connected between the output terminal and the second power source terminal and having a trigger terminal; and
    a trigger circuit coupled between the other of the drain and the source of the first MOS deice and the trigger terminal of the ESD protective circuit for supplying a trigger signal to the trigger terminal, wherein the first MOS device is configured to act as a part of the output buffer circuit at a time of normal operation state when an ESD voltage is not applied to the output terminal, and when the ESD voltage is applied to the output terminal, the first MOS device makes a trigger current flow from the first MOS device to the ESD protective circuit via the trigger circuit.

8. The semiconductor integrated circuit device according to claim 7, wherein the ESD protective circuit has a discharge path including a first bipolar transistor which becomes conductive due to the trigger signal output from the trigger circuit and discharges the ESD voltage.

9. The semiconductor integrated circuit device according to claim 7, wherein the trigger circuit is generally set to an off state in the normal operation state when no ESD voltage is applied and includes a second MOS device which supplies the trigger signal to the trigger terminal of the ESD protective circuit in accordance with an output from the first MOS device when the ESD voltage is applied.

10. The semiconductor integrated device according to claim 8, wherein the trigger circuit is generally set to an off state in the normal operation state, and includes a second MOS device which supplies the trigger signal to the trigger terminal of the ESD protective circuit in accordance with an output from the first MOS device when the ESD voltage is applied.

11. A semiconductor integrated circuit device comprising:
an internal circuit connected between first and second power source terminals, the internal circuit comprising an output buffer circuit connected across first and second power source terminals, the output buffer circuit including a first MOS device having a drain and a source forming a current path logically controlled by the internal circuit and one of the drain and source being connected to the output terminal;

a first ESD protective circuit connected between the first power source terminal and the output terminal; a second ESD protective circuit connected between the second power source terminal and the output terminal; wherein the output buffer circuit including:
  a first trigger signal supplying circuit which includes a first MOS device connected between the first power source terminal and the first ESD protective circuit, and when the ESD voltage is applied, supplies a trigger signal to the first ESD protective circuit; and
  a second trigger signal supplying circuit which includes a second MOS device connected between the output terminal and the second ESD protective circuit, and when the ESD voltage is applied, supplies a trigger signal to the second ESD protective circuit; and
wherein the first trigger signal supplying circuit includes a third MOS device connected between the first MOS device and the trigger terminal of the first ESD protective circuit, the third MOS device being held in a nonconductive state when no ESD voltage is applied; and
the second trigger signal supplying circuit includes a fourth MOS device connected between the second MOS device and the trigger terminal of the second ESD protective circuit, the fourth MOS device being held in a nonconductive state when no ESD voltage is applied.

12. The semiconductor integrated circuit device according to claim 11, wherein the first trigger signal supplying circuit is set in an inoperative state when the first power source terminal has a normal positive value, and when the ESD voltage is applied to the output terminal, an operative state is set by reversing the magnitude relation in relative voltage value between the source voltage value and the ESD voltage.

* * * * *